US010068780B2

(12) United States Patent
Prechtl et al.

(10) Patent No.: US 10,068,780 B2
(45) Date of Patent: Sep. 4, 2018

(54) LEAD FRAME CONNECTED WITH HETEROJUNCTION SEMICONDUCTOR BODY

(71) Applicant: Infineon Technologies Austria AG, Villach (AT)

(72) Inventors: Gerhard Prechtl, Rosegg (AT); Oliver Haeberlen, St. Magdalen (AT); Balamurugan Karunamurthy, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/215,208

(22) Filed: Jul. 20, 2016

(65) Prior Publication Data
US 2017/0025523 A1    Jan. 26, 2017

(30) Foreign Application Priority Data

Jul. 21, 2015 (DE) .................. 10 2015 111 838

(51) Int. Cl.
| | | |
|---|---|---|
| *H01L 21/56* | (2006.01) | |
| *H01L 23/495* | (2006.01) | |
| *H01L 29/778* | (2006.01) | |
| *H01L 29/423* | (2006.01) | |
| *H01L 29/08* | (2006.01) | |
| *H01L 29/20* | (2006.01) | |

(52) U.S. Cl.
CPC ........ *H01L 21/56* (2013.01); *H01L 23/49513* (2013.01); *H01L 23/49551* (2013.01); *H01L 23/49562* (2013.01); *H01L 29/7786* (2013.01); *H01L 29/0847* (2013.01); *H01L 29/2003* (2013.01); *H01L 29/42376* (2013.01); *H01L 2224/48247* (2013.01); *H01L 2224/73265* (2013.01)

(58) Field of Classification Search
CPC ....... H01L 2924/13064; H01L 29/2003; H01L 29/7786; H01L 29/7787; H01L 29/66462; H01L 29/205; H01L 29/778; H01L 29/7783; H01L 21/56; H01L 23/49562; H01L 23/49513; H01L 23/49551
See application file for complete search history.

(56) References Cited

U.S. PATENT DOCUMENTS

| | | | | |
|---|---|---|---|---|
| 5,648,682 A | * | 7/1997 | Nakazawa | .......... H01L 23/3107 257/673 |
| 6,373,124 B1 | * | 4/2002 | Kato | ................. H01L 23/49503 257/666 |
| 2005/0275089 A1 | * | 12/2005 | Joshi | .................. H01L 23/3107 257/727 |
| 2007/0166877 A1 | * | 7/2007 | Otremba | .......... H01L 23/49513 438/106 |
| 2014/0151717 A1 | | 6/2014 | Otremba | |

(Continued)

*Primary Examiner* — Tucker J Wright
(74) *Attorney, Agent, or Firm* — Murphy, Bilak & Homiller, PLLC

(57) ABSTRACT

A semiconductor component includes a semiconductor chip including a first semiconductor body comprising silicon and a second semiconductor body attached to an upper side of the first semiconductor body and comprising a III-nitride, and a lead-frame connected with the first semiconductor body. A thickness ratio between a thickness of the semiconductor chip and a thickness of the lead-frame is smaller than 1.3 or larger than 1.9.

21 Claims, 4 Drawing Sheets

(56) References Cited

U.S. PATENT DOCUMENTS

2014/0306332 A1 10/2014 Denison et al.
2016/0268190 A1* 9/2016 McKnight-MacNeil .................... H01L 23/49562

* cited by examiner

LEAD FRAME CONNECTED WITH HETEROJUNCTION SEMICONDUCTOR BODY

PRIORITY CLAIM

This application claims priority to German Patent Application No. 10 2015 111 838.6 filed on 21 Jul. 2015, the content of said application incorporated herein by reference in its entirety.

TECHNICAL FIELD

Embodiments of the present invention relate to semiconductor components including a chip carrier, in particular semiconductor components having a semiconductor chip including a compound semiconductor material, in particular a III-nitride semiconductor material, and a chip carrier and to related methods for producing semiconductor components.

BACKGROUND

In recent years, HEMTs (High Electron Mobility Field Effect Transistors) have found wider use in low loss high frequency and low loss high power applications. Gallium nitride (GaN) based HEMT-devices have been found to be particularly well suited for use in DC rectifiers, power microwave and radar amplifiers, low noise amplifiers, and high temperature elements, etc. Gallium nitride (GaN) material shows a high polarization effect, including spontaneous polarization and piezoelectric polarization. Even without being doped, this polarization effect allows forming a two-dimensional-electron gas (2DEG) adjacent to an interface (heterojunction) of a GaN/AlGaN (gallium nitride/aluminum gallium nitride) heterojunction structure (or GaN/AlInGaN, AlGaN/AlInGaN, aluminum indium gallium nitride). In a 2DEG, the electron concentration is related to the intensity of polarization. 2DEG sheet electron concentration of GaN/AlGaN heterojunction structures can reach very high values. Therefore, field-effect-transistors based on GaN/AlGaN heterojunction structures are able to control very large current.

Due to the ongoing developments of further shrinking, small chip carriers (small packages) such as SMD packages (surface-mount device) for III-nitride devices, in particular III-nitride devices formed by heteroepitaxy such as GaN-on-Si (gallium nitride on silicon) devices, are desired that allow dissipation of high power densities in small volumes during operation and/or fulfill standardized reliability tests such as the HTRB (high temperature reverse bias) test.

SUMMARY

According to an embodiment of a semiconductor component, the semiconductor component includes a heterojunction semiconductor body including a first semiconductor body comprising silicon and a second semiconductor body attached to an upper side of the first semiconductor body and comprising a III-nitride, and a lead-frame connected with the first semiconductor body. A thickness ratio between a first thickness of the heterojunction semiconductor body and a second thickness of the lead-frame is smaller than about 1.3 or larger than about 1.9.

According to an embodiment of a semiconductor component, the semiconductor component includes a lead-frame and a heterojunction semiconductor body including a first semiconductor body comprising silicon, and a second semiconductor body comprising a III-nitride and forming a heterojunction with the first semiconductor body. The first semiconductor body is glued on the lead-frame or soldered onto the lead-frame. The heterojunction semiconductor body has, in a vertical direction perpendicular to the heterojunction, a first vertical extension. The lead-frame has, in the vertical direction, a second vertical extension. Further, a vertical extension of the first semiconductor body is larger than about 1200 µm the second vertical extension is larger than about 500 µm and/or a thickness ratio between the first vertical extension and the second vertical extension is smaller than about 1.3 or larger than about 1.9.

According to an embodiment of a method of producing a semiconductor component, the method includes: providing a heterojunction semiconductor body including a first semiconductor body comprising silicon, and a second semiconductor body comprising a III-nitride and forming a heterojunction with the first semiconductor body, and attaching the first semiconductor body to a lead-frame. The method is performed such that, in a vertical direction perpendicular to the heterojunction, a thickness ratio between a first thickness of the heterojunction semiconductor body and a second thickness of the lead-frame is smaller than about 1.3 or larger than about 1.9.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts.

DETAILED DESCRIPTION

Figure 1A:
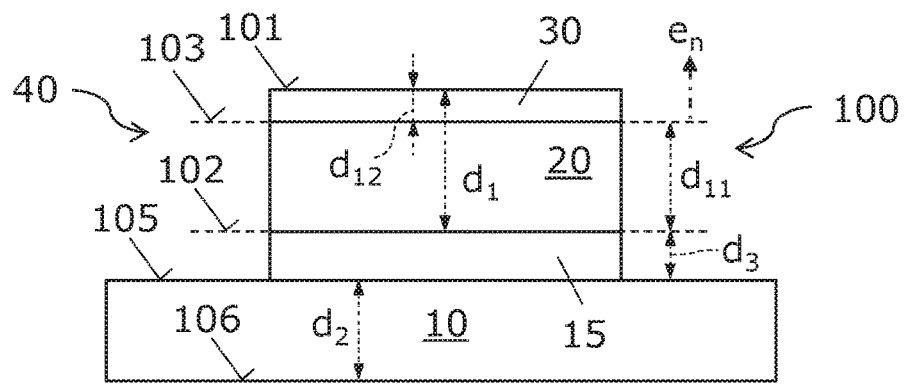
FIG. 1A illustrates a vertical cross-section through a semiconductor component according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first, upper or main horizontal side of a semiconductor substrate or body. This can be for instance the surface of a wafer or a die.

The term "vertical" as used in this specification intends to describe an orientation which is substantially arranged perpendicular to the first side, i.e. parallel to the normal direction of the first side of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, III-nitride based semiconductor components including a chip carrier, and to related manufacturing methods. The III-nitride based semiconductor components may include a heterojunction semiconductor structure, typically a HEMT-structure, formed in a semiconductor body comprising one or more III-nitrides, for example different layers of III-nitrides, and formed on a silicon semiconductor body attached to the chip carrier, typically a lead-frame.

The term "III-nitride" as used in this specification intends to describe a compound semiconductor material comprising nitrogen (N) and one or more of the following group 13 (old group III) elements: aluminium, gallium, indium. The term "III-nitride" intends to encompass binary alloys (two elements, e.g. GaN), ternary alloys (three elements, e.g. aluminium gallium nitride (AlGaN)) and quaternary alloys (four elements, e.g. aluminium gallium indium nitride (AlInGaN)). Within this specification the terms "III-nitride" and "nitride-based semiconductor material" are used synonymously.

III-nitrides are manufactured almost exclusively by epitaxial growth, typically on a silicon substrate (also referred to as GaN-on-Si technology), on a silicon carbide substrate or on sapphire. Silicon substrates are comparatively cheap. Furthermore, GaN-on-Si technology allows on-wafer integration of GaN-electronics and Si-electronics, e.g. Si-CMOS circuits.

Typically, the semiconductor component is a power semiconductor component.

The term "power semiconductor component" as used in this specification intends to describe a semiconductor component on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" and/or control of conductivity and/or shape of the channel in a semiconductor region using an insulated gate electrode or a Schottky-gate electrode.

In the context of the present specification, the term "gate electrode" intends to describe an electrode which is situated next to, and insulated from the semiconductor body and configured to form and/or control a channel region.

FIG. 1A illustrates a vertical cross-section through a semiconductor component 200. The semiconductor component 200 includes a lead-frame 10 and a semiconductor chip 100 having a heterojunction semiconductor body 40 including an upper semiconductor body 20 (also referred to second semiconductor body) and a lower semiconductor body 20 (also referred to as first semiconductor body) attached to the lead-frame 10 via a contact layer 15.

The first semiconductor body 20 is typically formed by a monocrystalline silicon substrate having an upper side 103, typically formed by a <111>-surface of the first semiconductor body 20. The second semiconductor body 30 comprises one or more III-nitrides, is attached to the upper side 103 and forms a heterojunction 103 with the first semiconductor body 20 at the upper side 103. For example, the semiconductor body 30 may include several layers of III-nitrides, typically epitaxially deposited layers of III-nitrides. The layers of III-nitrides may be parallel or at least substantially parallel to the upper side 103.

The heterojunction 103 and upper side 103, respectively define a vertical direction $e_n$.

Further, the heterojunction 103 formed between the first semiconductor body 20 and the second semiconductor body 30 is typically due to forming the second semiconductor body 30 on the first semiconductor body 2 and may not be used as part of an electronic structure, e.g. a lateral transistor structure, during operating the semiconductor component. The heterojunction 103 may, however, also be used as part of an electronic structure, e.g. a vertical transistor structure, during operating the semiconductor component.

As illustrated in FIG. 1A, an upper side 105 of the lead-frame 10 is connected via the contact layer 15 with a lowerside 102 of the first semiconductor body 20 arranged opposite the upper side 103 of the first semiconductor body 20 and an upper side 101 of the second semiconductor body 30 typically forming an upper side of the heterojunction semiconductor body 40 of the semiconductor chip 100. The contact layer 15 may include sub-layers, for example one or more promoting layers and a bonding layer. In one example, a layer stack of Ti/Ni/Ag is arranged at the lower side 102 to form the promoting layers facilitating a stable connection with a soft solder layer forming the bond layer. In another example, a layer stack of Au/Sn is arranged at the lower side 102 as promoting layers to ensure a stable connection with a diffusion solder layer forming the bond layer.

In the vertical direction, an extension $d_1$ of the heterojunction semiconductor body 40 of the semiconductor chip 100 between its lower side 102 and its upper side 101 may be determined as sum of an extension $d_{11}$ of the first semiconductor body 20 and an extension $d_{12}$ of the second semiconductor body 30 (total thickness of the first semiconductor body and the second semiconductor body).

In the following, the extension $d_1$ of the heterojunction semiconductor body 40 is also referred to as chip thickness, first vertical extension and first thickness. Likewise, an extension $d_2$ of the lead-frame 10 in the vertical direction (i.e. between a lower side 106 of the lead frame 10 and the upper side 105 of the lead frame 10) is in the following also referred to as lead-frame thickness, second vertical extension and second thickness. The extension $d_{11}$ of the first semiconductor body 20 and the extension $d_{12}$ of the second semiconductor body 30 are in the following also referred to as vertical extension $d_{11}$ of the first semiconductor body 20 and as vertical extension $d_{12}$ of the second semiconductor body 30, respectively.

The second vertical extension $d_2$ may be in a range from 100 µm to 1300 µm. For reasons of stability and heat removal, the second vertical extension $d_2$ is typically larger than 200 µm, more typical larger than 500 µm.

For reasons of electrical properties (like blocking voltage capabilities), the vertical extension $d_{12}$ of the second semiconductor body 30 may be comparatively thin, for example in a range from 1 µm to 10 µm. Typically, the vertical extension $d_{12}$ of the second semiconductor body 30 is less than a tenth of the vertical extension $d_{11}$ of the first semiconductor body 20.

The vertical extension $d_{11}$ of the first semiconductor body is typically larger than 30 µm, more typically larger than 200 µm. For example, $d_{11}$ may be below 250 µm. In other embodiments, $d_{11}$ may even be larger than 1200 µm, for example up to a about 2 mm.

According to an embodiment, a thickness ratio between the first vertical extension $d_1$ and the second vertical extension $d_2$ is smaller than 1.3 or larger than 1.9. As explained below in more detail with regard to FIG. 3A to FIG. 4B, this ensures high reliability of semiconductor component 200.

For example, the thickness ratio may be in a range from about 0.05 to about 1.25, more typically in a range from about 0.1 to about 1.2 or in a range from about 2.0 to about 10.

For reasons of costs, thickness ratios below 1.3 are more interesting than thickness ratio above 1.9.

The lead-frame 10 is typically made of a metal or an alloy having a high thermal conductivity such as aluminium or more typically copper. Accordingly, heat produced during operation of the semiconductor component 200 may efficiently be removed via the lead-frame 10.

The semiconductor chip 100 may be glued on the lead-frame 10 or soldered onto the lead-frame 10. The thickness $d_3$ of the contact layer 15 (also referred to as third thickness $d_3$ and contact layer thickness $d_3$) and/or the thickness ratio may depend on the type of connection.

In embodiments referring to contact layers 15 providing a soft solder connection between the lead-frame 10 and the first semiconductor body 20, the third thickness $d_3$ is typically in a range from about 10 µm to about 100 µm. Further, the thickness ratio is typically lower than 1.1 in embodiments referring to soft solder connections 15.

In embodiments referring to contact layers 15 providing a diffusion solder connection between the lead-frame 10 and the first semiconductor body 20, the third thickness $d_3$ is typically in a range from about 0.5 µm to about 10 µm. Further, the thickness ratio is typically lower than 0.9 in embodiments referring to diffusion solder connections 15.

In embodiments referring to contact layers 15 providing a glued connection between the lead-frame 10 and the first semiconductor body 20, the third thickness $d_3$ is typically in a range from about 5 µm to about 60 µm. Further, the thickness ratio is typically lower than 1.3 in embodiments referring to glued connections 15.

Figure 1B:
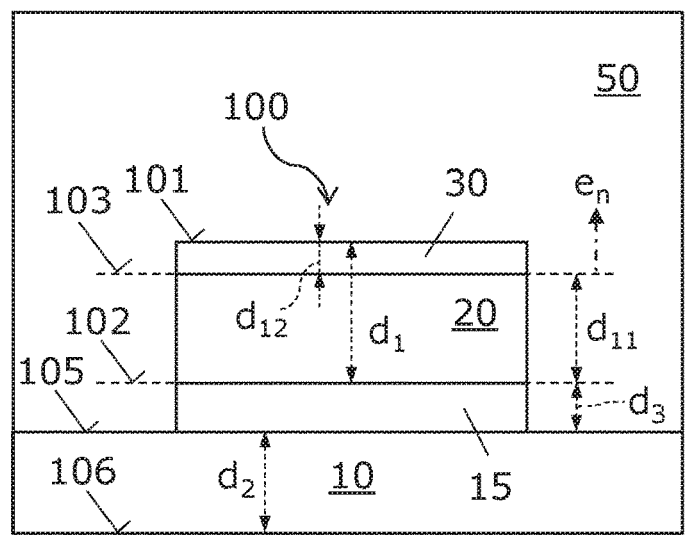
FIG. 1B illustrates a vertical cross-section through a semiconductor component according to an embodiment.

FIG. 1B illustrates a vertical cross-section through a semiconductor component 201. The semiconductor component 201 is similar to the semiconductor component 200 explained above with regard to FIG. 1A. However, the semiconductor component 201 further includes a mold compound 50 sealing the semiconductor chip 100 on the lead-frame 10. Accordingly, the semiconductor chip 100 is protected against moisture and mechanical damaging. Further, the heat transfer to the lead-frame 20 may be improved by the mold compound 50.

The mold compound 50 is typically a cured resin e.g. a cured epoxy resin.

As illustrated in FIG. 1B, the semiconductor chip 100 may be covered laterally and on top by the mold compound 50. Accordingly, both the vertical extension and the lateral extension(s) of the mold compound 50 are typically larger than the corresponding extensions of the semiconductor chip 100. For example, the vertical extension of the mold compound 50 may be larger than about 500 µm, or even larger than about 750 µm.

Further, the mold compound 50 may extend to the upper side 105 of the lead-frame 10.

Figure 2A:
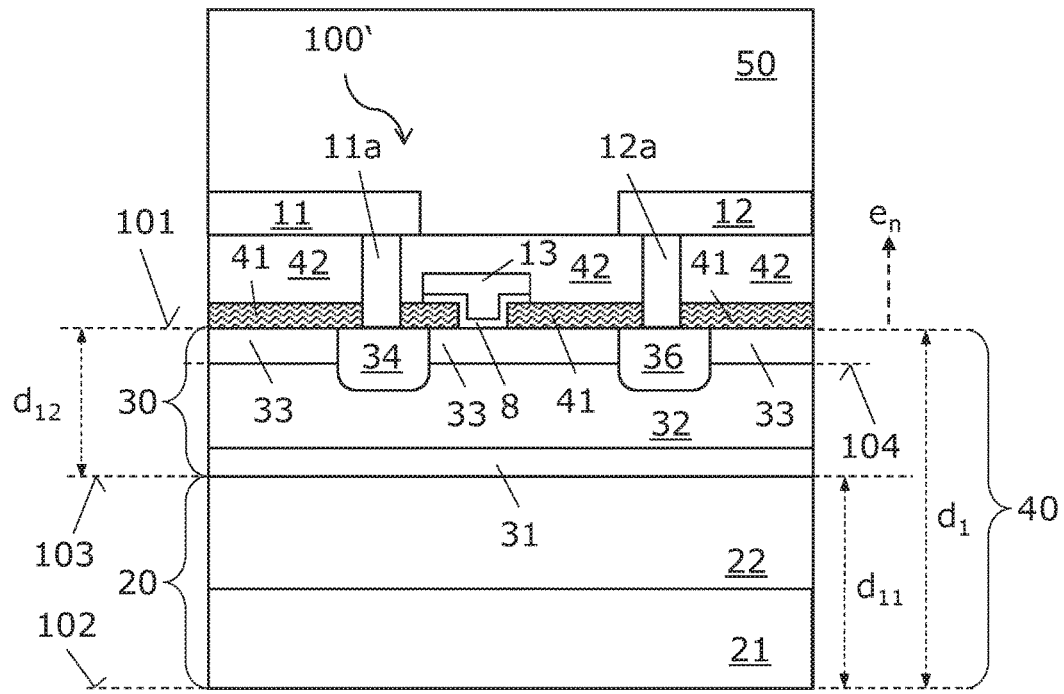
FIG. 2A illustrates a vertical cross-section through a semiconductor component according to an embodiment.

FIG. 2A illustrates an upper section of a vertical cross-section through a semiconductor component 202. The semiconductor component 202 is similar to the semiconductor component 200 explained above with regard to FIG. 1A and also includes a semiconductor chip 100' on a lead-frame. For sake of clarity, the lead-frame and the contact layer between the lead-frame and the first semiconductor body 20 are not shown in FIG. 2A.

In the exemplary embodiment, the semiconductor chip 100' is implemented as a HEMT.

The first semiconductor body 20 can be a single bulk mono-crystalline material (Si). It is also possible that the semiconductor body 20 includes a bulk mono-crystalline material 21 and at least one epitaxial layer 22 formed thereon. Using the epitaxial layer(s) 22 provides more freedom in tailoring the background doping of the material since the doping concentration can be adjusted during deposition of the epitaxial layer or layers.

For example, the first semiconductor body 20 may include a p-type semiconductor layer 21 forming a common substrate and extending to the lower side 102, and an $n^-$-type semiconductor layer 22 arranged on the p-type semiconductor layer 21. The doping relations may also be reversed.

In the exemplary embodiment, a second semiconductor body 30 having a heterojunction 104 is arranged on the first semiconductor body 20 at a common heterojunction 103 (typically formed at a <111>-surface of the first semiconductor body 20 forming the upper side of the first semiconductor body 20). Accordingly, the first semiconductor body 20 and the second semiconductor body 30 form a common heterojunction semiconductor body 40 with two typically parallel heterojunctions 103, 104.

In the exemplary embodiment, a HEMT-structure is formed in and on the second semiconductor body 30. The exemplary HEMT-structure includes an insulated gate electrode 13 arranged above the heterojunction 104 and insulated from the second semiconductor body 30 by a gate dielectric 8, for example a gate oxide.

Typically, the second semiconductor body 30 is formed by layers of wide band-gap semiconductor materials, more typically III-nitrides. In the exemplary embodiment, a substantially non-doped or a C-doped GaN-layer 31 is arranged on the underlying semiconductor layer 22. Typically, the GaN-layer 31 is formed on a thin AlN-layer (not shown) arranged at the <111>-surface 103 by epitaxial deposition. The GaN-layer 31 typically forms a buffer layer 31 of high resistivity. A low doped or un-intentionally doped (UID) GaN-layer 32 and an AlGaN (aluminum gallium nitride) layer 33 is formed on the buffer layer 31 and GaN-layer 32, respectively.

In the exemplary embodiment, the heterojunction 104 is formed between the further GaN-layer 32 and the AlGaN-layer 33, Alternatively, a graded buffer such an AlGaN buffer layer 31 or an AlN/GaN or more generally an $Al_xGa_{1-x}N/Al_yGa_{1-y}N$ superlattice-structure may be formed instead of the illustrated GaN-layer 31.

Furthermore, GaN/InAlGaN-heterostructures or AlGaN/AlInGaN heterostructures may be formed instead of the shown GaN/AlGaN-heterostructure by epitaxial deposition.

The HEMT-structure further includes a source region 34, a drain region 36 and a channel region extending in the further GaN-layer 32 at the heterojunction 104 between the source region 34 and the drain region 36. In the exemplary embodiment, the source region 34 and the drain region 36 are highly n-doped, while the AlGaN-layer 33 and the further GaN-layer 32 are n-doped and substantially non-doped, respectively. Furthermore, the AlGaN-layer 33 may also be substantially non-doped. Due to the spontaneous and piezoelectric polarization between the AlGaN/GaN interface forming the heterojunction 104, a positive net charge is formed leading to an attraction of electrons. These electrons are provided by surfaces charges at the heterojunction 104 leading to the formation of a two dimensional high mobility electron gas within a thin channel layer of about 10 nm. The conductivity of the thin channel layer may be controlled by the insulated gate electrode 13. Alternatively, a non-insulated Schottky gate may be used to control the conductivity of the thin channel layer.

On the upper side 101 of the second semiconductor body 30 and common semiconductor body 40, respectively, one or several insulating layers 41, 42, for example a silicon nitride layer 41 and a silicon oxide layer 42, are typically formed.

A source metallization 11 and a drain metallization 12 may be arranged on one or several insulating layers 41, 42.

Further, contacts 11a, 12a, for example metal or doped poly-silicon contacts, may extend through the one or several insulating layers 41, 42 to electrically contact the source region 34 and the drain region 36 of the HEMT-structure 121.

The gate electrode 13 may be connected via a gate contact to a gate metallization (both not shown in FIG. 2A) in a different vertical cross-section.

Figure 2B:
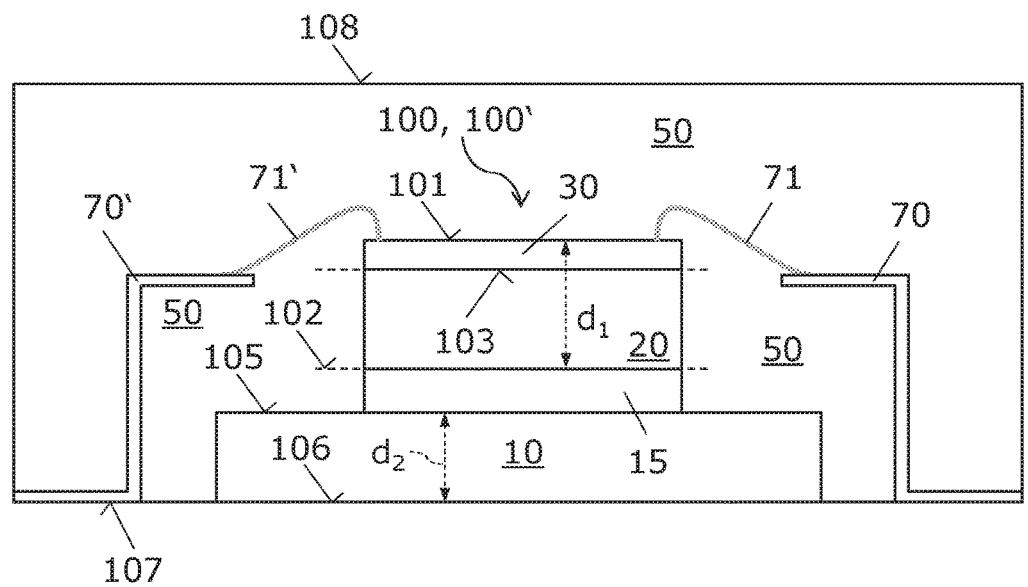
FIG. 2B illustrates a vertical cross-section through a semiconductor component according to an embodiment.

FIG. 2B schematically illustrates a vertical cross-section through a semiconductor component 203. The semiconductor component 203 is similar to the semiconductor components 200 to 202 as explained above with regard to FIG. 1A to FIG. 2A. The semiconductor component 203 also includes a semiconductor chip 100, 100' as explained above with regard to FIG. 1A to FIG. 2A.

However, the semiconductor component 203 further includes two or more pins 70, 70' partly embedded in the mold compound 50. In the exemplary embodiment, lower portions of the pins 70, 70' are accessible from below.

The pins 70, 70' may be connected via respective bond wires 71, 71' with metallizations of the semiconductor chip 100, 100'. For example, the pins 70, 70' may be connected with a source metallization, a drain metallization or a gate metallization of the semiconductor chip 100, 100'.

The pins 70, 70' are typically used for connecting the semiconductor component 203 to circuits, e.g. on a printed circuit board (PCB).

The semiconductor component 203 may be of any packaging type such as ThinPAK, TO220, DSO and TOLL.

The mold compound 50 may form an upper side 108 of the semiconductor component 203 and extend to a lower side 107 of the semiconductor component 203 opposite to the upper side 108.

In the exemplary embodiment, lower portions of the pins 70, 70 and the lower side 106 of the lead-frame 10 form together with intervening lower portions of the mold compound 50 a substantially flat lower side 107 of the semiconductor component 203. This may facilitate mounting of the semiconductor component 203, e.g. on a PCB.

For reasons of good heat removal, the lead-frame 10 is typically only partly embedded in the mold compound 50.

In vertical cross-sections perpendicular to the vertical cross-section of FIG. 2B, the lead-frame 10 may even extend at least through one side of the mold compound 50. This may improve heat removal. However, this typically depends on the packaging type. For example, the lead-frame 10 may extend through one side of the mold compound 50 in a TO220 package but may be completely surrounded by the mold compound 50 when seen from below in a ThinPAK design.

Furthermore, the geometry and the arrangement of the pins may depend on the packaging type. For example, the pins may extend through sidewalls of the mold compound 50 in a DSO-package.

Further, the semiconductor component 203 may include a not illustrated chip housing (also referred to as casing) surrounding the semiconductor chip 100, 100, the lead-frame 10 and the mold compound 50 in the shown cross-section. Accordingly, the protection of the semiconductor component 203 against external impacts is improved. In other cross-sections parallel to the vertical cross-section of FIG. 2B, the chip housing 60 may completely enclose the semiconductor chip 100, 100', the lead-frame 10 and the mold compound 50. The chip housing may be a plastic housing. However, the material and/or the design of the chip housing typically depend on the packaging type.

The package processes typically include attaching the semiconductor chip (also referred to as die) to a lead-frame and subsequently molding. Thereafter, the molded chip may be boxed in a housing.

During attaching and molding, the semiconductor chip is exposed to thermal loads resulting in mechanical stress. For example, the semiconductor chip is exposed to a temperature of about 320° C. during soft soldering or about 180° C. during gluing. After cooling to room temperature, the semiconductor chip is again heated to a temperature of e.g. 207° C. during molding using an epoxy molding compound.

The authors observed that standard packaging of GaN-on-Si chips may result in semiconductor components showing an insufficient performance in reliability tests, in particular in life time tests. For example, GaN-on-Si chips with a 6 µm thick GaN-semiconductor body formed on a 250 µm thick Si-semiconductor body soldered onto a 200 µm copper lead-frame and packaged as ThinPAK often fail in HTRB-tests.

According to simulations, thermally induced mechanical stress seems to be the most important factor of packaging with regard to reliability. It turned out that soldering of the semiconductor chip to the lead-frame is typically more critical than molding and that soldering is typically more critical than gluing the semiconductor chip to the lead-frame.

Figure 3A:
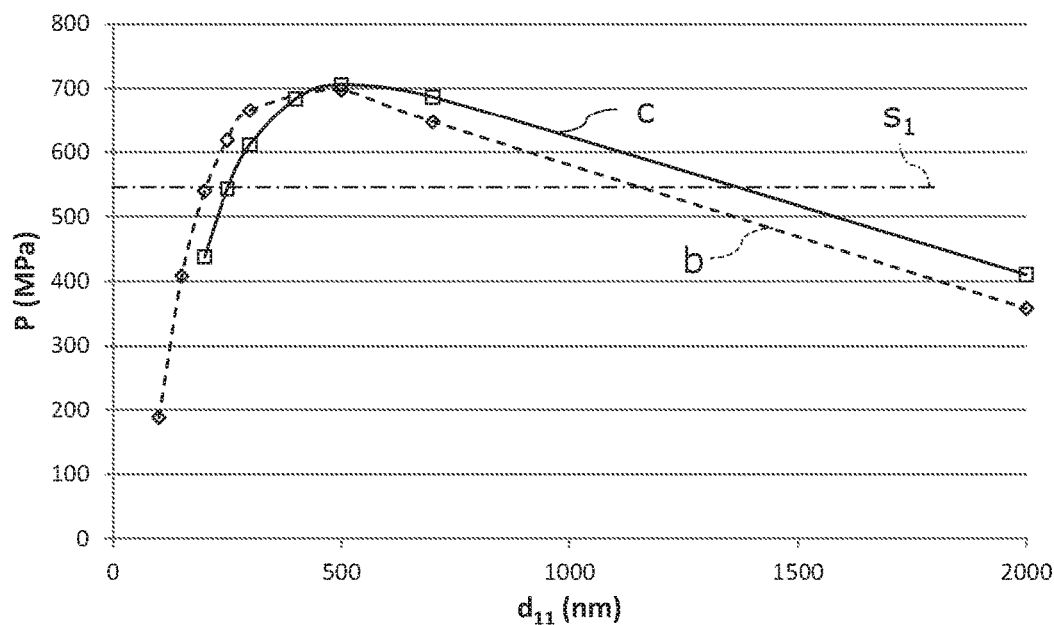
FIG. 3A illustrates mechanical surface stress levels acting on a semiconductor chip of a semiconductor component as illustrated in FIG. 1A as function of a thickness of the semiconductor chip.

FIG. 3A illustrates the mechanical stress P during soft soldering of a semiconductor chip 100 as illustrated in FIG. 1A and having a 6 µm-thick GaN-semiconductor body 30 ($d_{12}$=6 µm) on a Si-semiconductor body 20 soldered to a 200 µm thick copper lead-frame as function of the vertical extension $d_{11}$ of the Si-semiconductor body 20. The mechanical stress P is given as maximum surface stress at the center of the upper GaN-surface 101 of the second semiconductor body 30 (maximum surface stress acts at the center of the upper GaN-surface). Curves b and c correspond to lead-frame layer thicknesses $d_2$ of 200 µm and 250 µm, respectively. Depending on the vertical extension $d_{11}$, high tensile stress values (positive values of P correspond to tensile stress) can occur. The two semiconductor compound designs with tensile stresses during soft soldering of about 540 MPa were found to have a dramatically improved failure rates in HTRB-tests compared to the semiconductor compound designs with tensile stresses above 600 MPa. The failure rates in HTRB-tests may be attributed to micro cracks formed during soldering. The dashed-dotted line $s_1$ represents the tensile stress threshold of 540 MPa for stable device operation.

Interestingly, the maximum surface stress P and the failure rates in HTRB-tests non-monotonically depend on the vertical extension $d_{11}$. The maximum surface stress P remains below the critical value of 540 mPa for vertical extension $d_{11}$ which are either smaller than about 250 nm or larger than about 1200 nm.

In the embodiments illustrated in FIG. 3A, the vertical extension $d_{11}$ of the Si-semiconductor body 20 is at least about 15 times larger than the vertical extension $d_{12}$ of the GaN-semiconductor body 30.

Further investigation show that the maximum surface stress P only slightly changes with the vertical extension $d_{12}$ of the GaN-semiconductor body 30 if the Si-semiconductor body 20 is at least about 10 times larger than the vertical extension $d_{12}$ of the GaN-semiconductor body 30, for example if the vertical extension $d_{12}$ is in a range from 1 µm to 10 µm and the vertical extension $d_{11}$ is larger than 100 µm.

Further, the third thickness $d_3$ of the soft solder forming the contact layer does not have a significant influence on the surface stress levels, at least if the third thickness $d_3$ is in a range between 10 µm and 100 µm.

By investigating the different parameter sets, it was found that the chip thickness $d_1$ ($d_1$=$d_{11}$+$d_{12}$), which may be approximated by the vertical extension $d_{11}$ if the vertical extension $d_{12}$ is small compared to the vertical extension $d_{11}$, and the lead-frame thickness $d_2$, more particular the thickness ratio between the chip thickness $d_1$ and the lead-frame thickness $d_2$ may be used to establish criterions for high device reliability. This is explained below in more detail.

Figure 3B:
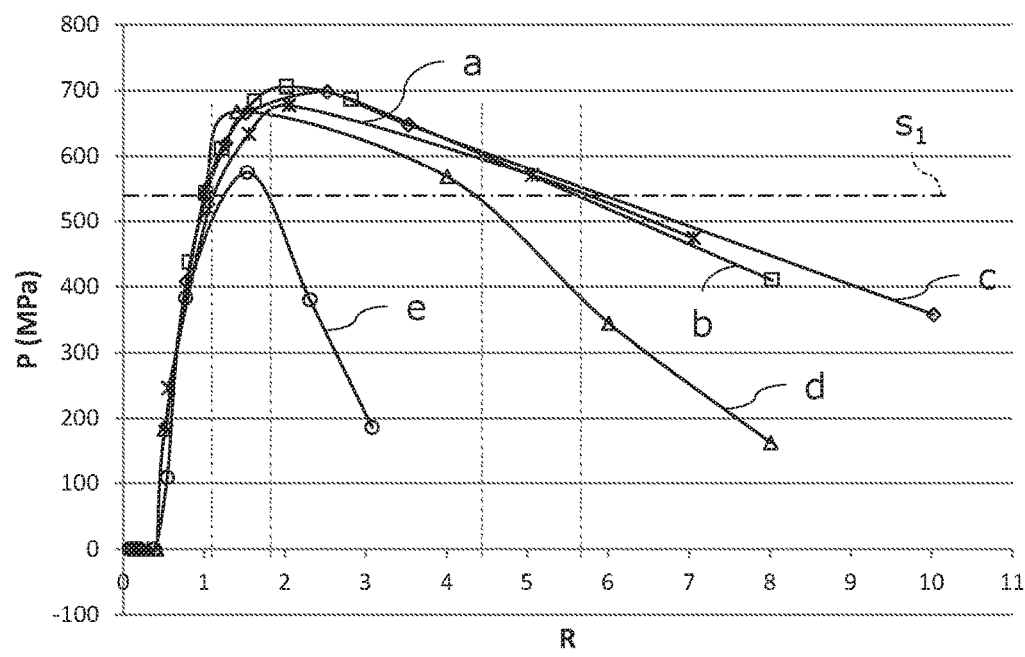
FIG. 3B illustrates mechanical surface stress levels acting on a semiconductor chip of a semiconductor component as illustrated in FIG. 1A as function of a ratio between a thickness of the semiconductor chip and a thickness of a lead-frame of the semiconductor component.

FIG. 3B illustrates the maximum surface stress P at the center of the upper GaN-surface of a semiconductor chip of the semiconductor component illustrated in FIG. 1A as function of the thickness ratio R between the chip thickness $d_1$ and the lead-frame thickness $d_2$. Curves a, b, c, d and e correspond to lead-frame thicknesses $d_2$ of 100 µm (curve a), 200 µm (curve b), 250 µm (curve c), 500 µm (curve d), and 1.3 µm (curve e), respectively. The other parameters are as explained above with regard to FIG. 3A.

Within the studied lead-frame thicknesses range between 100 µm und 1300 µm, thickness ratios R below 1.1 ensure high device reliability for GaN-on-Si devices attached to the lead-frame using a soft solder such as e.g. PbSnAg or a lead-free solder. For lead-frame thicknesses $d_2$ below 250 µm, between 250 and 500 µm, and between 500 and 1.3 mm also stable package configurations are obtained for thickness ratios R larger than 5.8, 4.5 and 1.9, respectively (see the dashed vertical lines in FIG. 3B).

Figure 4A:
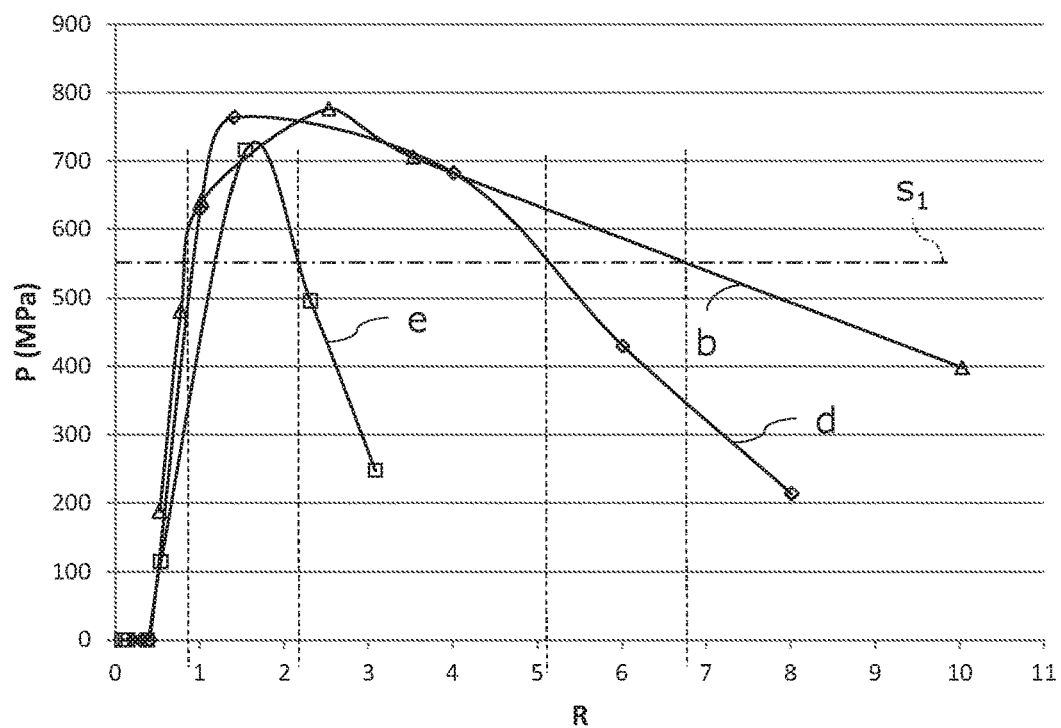
FIG. 4A illustrates mechanical surface stress levels acting on a semiconductor chip of a semiconductor component as illustrated in FIG. 1A as function of a ratio between a thickness of the semiconductor chip and a thickness of a lead-frame of the semiconductor component.

FIG. 4A illustrates the maximum surface stress P at the center of the upper GaN-surface of a semiconductor chip of the semiconductor component illustrated in FIG. 1A as function of the thickness ratio R between the chip thickness $d_1$ and the lead-frame thickness $d_2$. Curves b, d and e correspond to lead-frame thicknesses $d_2$ of 200 µm (curve b), 500 µm (curve d), and 1.3 mm (curve e), respectively. The maximum surface stresses P shown in FIG. 4A correspond to GaN-on-Si chips soldered onto the lead frame using a diffusion solder such as AuSn. The other parameters are as explained above with regard to FIG. 3A. The solder thickness $d_3$ is found to have only a minor influence on the surface stress levels, at least if $d_3$ is in a range between 0.5 µm and 10 µm.

Due to the higher mechanical stress induced by diffusion solder compared to soft solder, the thickness ratio R ensuring high chip reliability is slightly shifted. Thickness ratios R below 0.9 ensure high device reliability for GaN-on-Si devices attached to the lead-frame using a diffusion solder. For lead-frame thicknesses $d_2$ below 250 µm, between 250 µm and 500 µm, and between 500 µm and 1.3 mm also stable package configurations are obtained for R larger than 6.8, 5.1 and 2.2, respectively (see the dashed vertical lines in FIG. 4A).

Figure 4B:
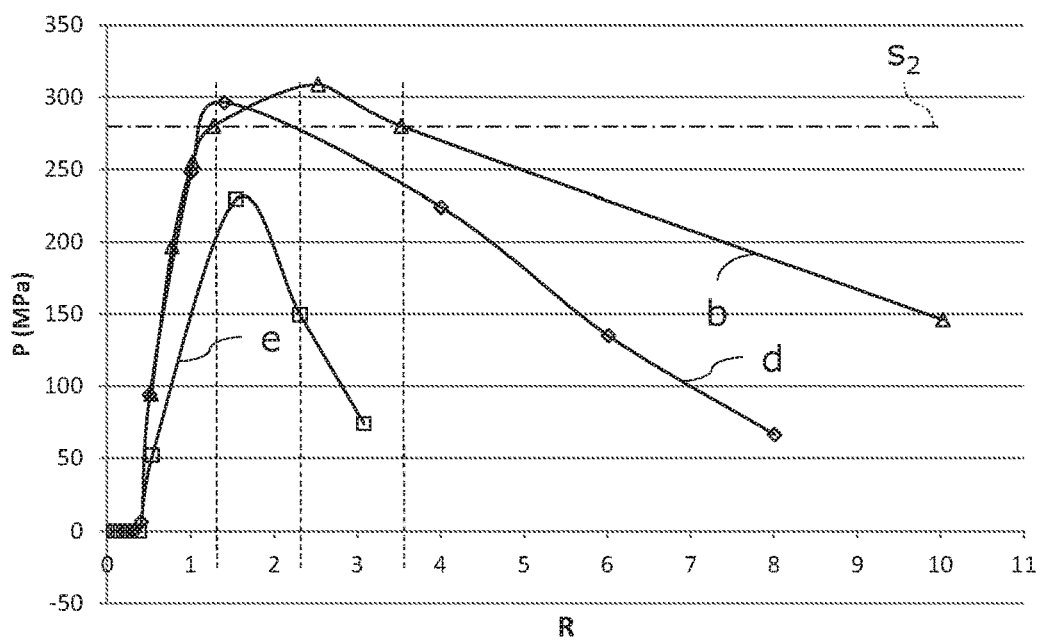
FIG. 4B illustrates mechanical surface stress levels acting on a semiconductor chip of a semiconductor component as illustrated in FIG. 1A as function of a ratio between a thickness of the semiconductor chip and a thickness of a lead-frame of the semiconductor component.

FIG. 4B illustrates the maximum surface stress P at the center of the upper GaN-surface of a semiconductor chip of the semiconductor component illustrated in FIG. 1A as function of the thickness ratio R between the chip thickness $d_1$ and the lead-frame thickness $d_2$. Curves b, d and e correspond to lead-frame thicknesses $d_2$ of 200 µm (curve b), 500 µm (curve d), and 1.3 mm (curve e), respectively. The maximum surface stresses P shown in FIG. 4B correspond to GaN-on-Si chips glued onto the lead frame. The other parameters are as explained above with regard to FIG. 3A.

It is found that the life time criteria after 1000 h of HTRB testing are met by GaN-on-Si chips glued on the lead-frame, if the maximum surface stress P during gluing is lower than about 280 MPa (dashed-dotted line $s_2$), i.e. if thickness ratio R is below 1.3. For lead-frame thicknesses $d_2$ below 250 µm, and between 250 µm and 600 µm also stable package configurations may be obtained for thickness ratio R larger than 3.5 and 2.2, respectively. For lead-frame thicknesses $d_2$ above 600 µm all chip thickness configurations are found to be stable with regard to HTRB life time requirements (see the dashed vertical lines in FIG. 4B). For chip thicknesses $d_1$ of less than about 600 µm, the thickness ratio R is typically smaller than 1.0.

Due to similar stresses, the presented results and the derived design rules for GaN-on-Si chips also apply to other III-nitride formed on silicon.

Accordingly, a method of producing a semiconductor component includes providing a heterojunction semiconductor body and having a first semiconductor body comprising silicon, and a second semiconductor body comprising a III-nitride and forming a heterojunction with the first semiconductor body, and attaching the first semiconductor body to a lead-frame. The method is performed such that thickness ratio R between a chip thickness $d_1$ and a lead-frame thickness $d_2$ is smaller than 1.3 or larger than 1.9. This typically means that the chip thickness $d_1$ and a lead-frame thickness $d_2$ are chosen so that the thickness ratio R is outside the range of 1.3 to 1.9.

Prior to attaching to the lead-frame, processing the heterojunction semiconductor body may already be a finished. This means that processing at wafer-level is finished and the used heterojunction wafer is divided into individual semiconductor chips including the heterojunction semiconductor body, e.g. individual HEMTs. In these embodiments, the first process may also be described as providing a semiconductor chip including a heterojunction semiconductor body having a first semiconductor body comprising silicon, and a second semiconductor body comprising a III-nitride.

For attaching, the first semiconductor body may be glued on the lead-frame. In these embodiments, the thickness ratio R is typically smaller than 1.3.

Alternatively, the first semiconductor body may be soldered onto the lead-frame.

Prior to gluing or soldering, one or more promoting layers are typically formed on and/or at the lower side of the first semiconductor body.

If a soft solder is used for soldering, the thickness ratio R is typically smaller than 1.1.

If a diffusion solder is used for soldering or if metal sintering is used for connecting the first semiconductor body with the lead-frame, the thickness ratio R is typically smaller than 0.9.

Providing the semiconductor chip typically includes providing a Si-semiconductor body and forming a III-nitride semiconductor body on the Si-semiconductor body using epitaxial depositing.

For example, providing the semiconductor chip may include one or more of the following processes:
  providing a first semiconductor body made of monocrystalline silicon,
  forming an $Al_xGa_{1-x}N/Al_yGa_{1-y}N$ superlattice structure on the first semiconductor body,
  forming a GaN/InAlGaN-heterostructure including a further heterojunction, a AlGaN/AlInGaN-heterostructure including a further heterojunction or an GaN/AlGaN-heterostructure including a further heterojunction on the first semiconductor body,
  epitaxial depositing $Al_xGa_{(1-x)}N$ (with $0<=x<=1$) on a <111>-surface of the first semiconductor body to form a further heterojunction,
  forming a GaN-layer above the heterojunction using epitaxial depositing,
  epitaxial depositing $In_xAl_yGa_{(1-x-y)}N$ (with $0<x+y<=1$, $0<=x$ and $0<=y$) on the GaN-layer to form a further heterojunction above the heterojunction, and
  forming a gate electrode next to the further heterojunction.

All, some or one of the III-nitride-layers may be doped. For example, a C-doping (doping with carbon) may be used to compensate the intrinsic conductivity of III-nitrides. Further, a p-doped GaN-layer below a gate may be provided to achieve normally off device characteristics.

Typically, the manufactured semiconductor component includes a semiconductor chip including a first semiconductor body, e.g. made of mono-crystalline silicon, and a second semiconductor body comprising a III-nitride, e.g. several III-nitride-layers, and forming a heterojunction with the first semiconductor body, and a lead-frame opposite the second semiconductor body and connected with the first semiconductor body. A thickness ratio between a total thickness of the first semiconductor body and the second semiconductor body and a thickness of the lead-frame is smaller than about 1.3 or larger than about 1.9.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc, and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor component, comprising:
  a heterojunction semiconductor body comprising a first semiconductor body comprising silicon and a second semiconductor body attached to an upper side of the first semiconductor body and comprising a III-nitride; and
  a lead-frame connected with the first semiconductor body, wherein a thickness ratio between a first thickness of the heterojunction semiconductor body and a second thickness of the lead-frame is smaller than 1.3 or larger than 1.9.

2. The semiconductor component of claim 1, further comprising:
   a contact layer connecting the first semiconductor body with the lead-frame.
3. The semiconductor component of claim 2, wherein the contact layer provides a soft solder connection between the lead-frame and the first semiconductor body, and wherein the thickness ratio is lower than 1.1.
4. The semiconductor component of claim 3, wherein the contact layer has a third thickness in a range from about 10 μm to about 100 μm.
5. The semiconductor component of claim 2, wherein the contact layer provides a diffusion solder connection or a metal sintering connection between the lead-frame and the first semiconductor body, wherein the thickness ratio is less than 0.9, and/or wherein the contact layer has a third thickness in a range from about 0.5 μm to about 10 μm.
6. The semiconductor component of claim 2, wherein the contact layer provides a glued connection between the lead-frame and the first semiconductor body, wherein the contact layer has a third thickness in a range from about 5 μm to about 60 μm, and/or wherein the thickness ratio is smaller than 1.0 and the first thickness is smaller than 600 μm.
7. The semiconductor component of claim 1, further comprising:
   a mold compound sealing the heterojunction semiconductor body on the lead-frame.
8. The semiconductor component of claim 1, wherein a thickness of the first semiconductor body is at most about 250 μm.
9. The semiconductor component of claim 1, wherein the III-nitride is gallium nitride; and/or wherein the second semiconductor body comprises one or more of:
   a GaN-layer, a $In_xAl_yGa_{(1-x-y)}N$-layer, an $Al_xGa_{1-x}N/Al_yGa_{1-y}N$ superlattice structure, a heterojunction, and a HEMT-structure.
10. The semiconductor component of claim 1, wherein a heterojunction between the first semiconductor body and the second semiconductor body is formed at the upper side.
11. The semiconductor component of claim 1, wherein the thickness of the lead-frame is in a range from about 100 μm to about 2 mm, wherein a thickness of the second semiconductor body is in a range from about 1 μm to about 10 μm, and/or wherein the lead-frame is connected with a lower side of the first semiconductor body opposite to the upper side.
12. The semiconductor component of claim 1, wherein the lead-frame comprises a metal.
13. A semiconductor component, comprising: a heterojunction semiconductor body comprising a first semiconductor body comprising silicon, and a second semiconductor body comprising a III-nitride and forming a heterojunction with the first semiconductor body, wherein the heterojunction semiconductor body has, in a vertical direction perpendicular to the heterojunction, a first vertical extension; and
   a lead-frame having, in the vertical direction, a second vertical extension, wherein the first semiconductor body is glued on the lead-frame or soldered onto the lead-frame, and wherein a thickness ratio between the first vertical extension and the second vertical extension is smaller than 1.3 or larger than 1.9.
14. The semiconductor component of claim 13, wherein the first semiconductor body is glued on the lead-frame, and wherein the thickness ratio is smaller than 1.3.
15. The semiconductor component of claim 13, wherein the first semiconductor body is soldered onto the lead-frame, and wherein the thickness ratio is smaller than 1.1.
16. A method of producing a semiconductor component, the method comprising:
   providing a heterojunction semiconductor body comprising a first semiconductor body comprising silicon, and a second semiconductor body comprising a III-nitride and forming a heterojunction with the first semiconductor body; and
   attaching the first semiconductor body to a lead-frame, so that, in a vertical direction perpendicular to the heterojunction, a thickness ratio between a first thickness of the heterojunction semiconductor body and a second thickness of the lead-frame is smaller than 1.3 or larger than 1.9.
17. The method of claim 16, further comprising:
   sealing the heterojunction semiconductor body on the lead-frame using a resin.
18. The method of claim 16, wherein providing the heterojunction semiconductor body comprises one or more of:
   epitaxial depositing $Al_xGa_{(1-x)}N$ on a <111>-surface of the first semiconductor body to form the heterojunction;
   forming a GaN-layer above the heterojunction comprising epitaxial depositing; and
   epitaxial depositing $In_xAl_yGa_{(1-x-y)}N$ on the GaN-layer to form a further heterojunction above the heterojunction.
19. The method of claim 16, wherein the first semiconductor body is soldered onto the lead-frame, and wherein the thickness ratio is smaller than 1.1.
20. The method of claim 15, wherein a soft solder is used for attaching.
21. The method of claim 15, wherein the first semiconductor body is glued on the lead-frame, and wherein the thickness ratio is smaller than 1.3.

* * * * *